(12) United States Patent  
Deehan et al.

(10) Patent No.: US 8,721,796 B2
(45) Date of Patent: May 13, 2014

(54) PLASMA CLEANING APPARATUS AND METHOD

(75) Inventors: Martin Deehan, Pleasanton, CA (US); Matt Cheng-Hsiung Tsai, Cupertino, CA (US); Nan Lu, Santa Clara, CA (US); David T. Or, Santa Clara, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 792 days.

(21) Appl. No.: 12/582,905

(22) Filed: Oct. 21, 2009

(65) Prior Publication Data

US 2010/0101602 A1   Apr. 29, 2010

Related U.S. Application Data

(60) Provisional application No. 61/107,916, filed on Oct. 23, 2008.

(51) Int. Cl.
*B08B 6/00* (2006.01)

(52) U.S. Cl.
USPC ............ 134/1.1; 134/1; 134/22.1; 134/22.18

(58) Field of Classification Search
None
See application file for complete search history.

(56) References Cited

U.S. PATENT DOCUMENTS

| | | | |
|---|---|---|---|
| 5,861,086 A | 1/1999 | Khurana et al. | |
| 6,074,518 A * | 6/2000 | Imafuku et al. | 156/345.46 |
| 2004/0031677 A1* | 2/2004 | Wang et al. | 204/192.17 |

FOREIGN PATENT DOCUMENTS

JP         05021391 A  *  1/1993

* cited by examiner

*Primary Examiner* — Eric Golightly
(74) *Attorney, Agent, or Firm* — Patterson & Sheridan, LLP

(57) ABSTRACT

Embodiments of the present invention generally include an apparatus for plasma cleaning and a method for plasma cleaning. The apparatus can include a lid body having a first surface for facing a pedestal during cleaning and a second surface opposite the first surface and substantially parallel to the first surface, the second surface having a first indentation sized to receive a magnet assembly, one or more handles coupled to the second surface of the lid body, and the magnet assembly resting in the first indentation. The method can include removing a sputtering target from the processing chamber, sealing the processing chamber, introducing a gas into the processing chamber, applying an RF bias to a pedestal within the processing chamber, maintaining the pedestal at a substantially constant temperature, and removing material from the pedestal to clean the pedestal.

9 Claims, 4 Drawing Sheets

PLASMA CLEANING APPARATUS AND METHOD

CROSS-REFERENCE TO RELATED APPLICATIONS

This application claims benefit of U.S. Provisional Patent Application Ser. No. 61/107,916, filed Oct. 23, 2008, which is herein incorporated by reference.

BACKGROUND OF THE INVENTION

1. Field of the Invention

Embodiments of the present invention generally relate to a plasma cleaning apparatus and method.

2. Description of the Related Art

Physical vapor deposition (PVD) is a method of depositing a material onto a substrate. A PVD apparatus may have a sputtering target disposed within a processing chamber and situated opposite a substrate. A sputtering gas, such as argon, is introduced into the chamber. The sputtering target, when metallic, may be electrically biased with a DC current to ignite the argon gas into a plasma. The substrate, on the other hand, may be grounded to act as an anode relative to the electrically biased sputtering target. Atoms from the sputtering target may eject or sputter from the sputtering target and deposit on the substrate.

While the atoms from the sputtering target may deposit onto the substrate, the atoms may also deposit on exposed surfaces within the chamber. For example, material may be deposited on the chamber walls. Over time, the material deposited onto the chamber walls may build up to a sufficient thickness that the chamber needs to be cleaned. Additionally, material deposited onto the walls may flake off and land on other areas of the chamber.

When a substrate is inserted or removed from the chamber, opening and closing of a slit valve may cause material to flake off and deposit on undesired surfaces such as the susceptor. When material accumulates onto the susceptor, the susceptor may not function effectively. Thus, the processing chamber may periodically need to be cleaned to remove undesired material deposits.

Additionally, dielectric material may be deposited onto the substrate in other chambers. Whenever the chamber is opened to permit a substrate to enter and/or exit the chamber, dielectric material may enter into the chamber. The dielectric material may be present in the other chamber and flow into the chamber where it may condense on the chamber surfaces, including the susceptor. If the susceptor is an electrostatic chuck and sufficient dielectric material builds up on the susceptor, the electrostatic charge of the susceptor, when biased, may be shielded by the dielectric material and prevent the substrate from being attracted to the susceptor. If there is sufficient dielectric material built up on the susceptor, the substrate may pop off of the susceptor due to insufficient electrostatic charge, possibly resulting in damage to the substrate and/or chamber components.

Therefore, there is a need in the art for an apparatus and a method to clean a processing chamber.

SUMMARY OF THE INVENTION

Embodiments of the present invention generally include an apparatus for plasma cleaning and a method for plasma cleaning. Periodically, a PVD chamber may need to be cleaned to remove material that has built up in undesired locations within the chamber. Additionally, the sputtering target may need to be replaced. By removing the sputtering target and placing a grounded chamber lid in its place, the chamber may be plasma cleaned. The susceptor within the chamber may be electrically biased with an RF current. A stationary magnet assembly may be substantially centered behind the grounded lid to focus the cleaning plasma on the susceptor. Following the plasma cleaning, the magnet and lid may be removed and the sputtering target may be coupled to the chamber to continue processing.

In one embodiment, an apparatus includes a chamber body having a base and a plurality of sidewalls coupled to ground, a first chamber lid assembly coupled to the chamber body, and a second chamber lid assembly separate from the first chamber lid assembly and resting on the chamber body. The first chamber lid assembly may comprise an electrode, a magnetron assembly positioned behind the sputtering target, and a first lid enclosing the magnetron assembly. The second chamber lid assembly may comprise a second lid having a first surface for facing the base and a second surface disposed opposite the first surface. The second chamber lid assembly may also have a magnet assembly having one or more magnets therein. The magnet assembly rests on the second surface of the second lid.

In another embodiment, an apparatus includes a chamber body having a base and a plurality of grounded sidewalls and a first lid disposed opposite the base and in contact with the plurality of sidewalls to enclose a processing area. The first lid has a first surface facing the base and a second surface opposite the first surface. The first lid is electrically coupled to the chamber body. The apparatus also includes a second lid assembly pivotably coupled to the chamber body and having a sputtering target, a magnetron assembly positioned behind the sputtering target, a second lid enclosing the magnetron assembly, and a cover coupled with the second lid to enclose the magnetron assembly and sputtering target. The apparatus also includes a susceptor disposed within the processing area. The susceptor is coupled to and extends from the base. The apparatus also includes one or more magnet assemblies coupled to the second surface of the lid. The one or more magnet assemblies are substantially centered over the susceptor.

In another embodiment, a method of servicing a processing chamber is disclosed. The method includes pivoting a first lid from the processing chamber to expose a processing space. The processing chamber has a base and a plurality of grounded chamber walls that enclose the processing space. The method also includes placing a second lid, separate from the first lid, into contact with the plurality of grounded chamber walls to re-enclose the processing space. The method additional may include placing a magnet assembly on a surface of the second lid opposite to the processing space and applying an RF current to a susceptor disposed in the processing space.

In another embodiment, a method for cleaning a processing chamber is disclosed. The method includes removing a sputtering target from the processing chamber and sealing the processing chamber. The method also includes introducing a gas into the processing chamber and applying an RF bias to a pedestal within the processing chamber. The method also includes maintaining the pedestal at a substantially constant temperature and removing material from the pedestal to clean the pedestal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally include an apparatus for plasma cleaning and a method for plasma cleaning. Periodically, a PVD chamber may need to be cleaned to remove material that has built up in undesired locations within the chamber. Additionally, the sputtering target may need to be replaced. By removing the sputtering target and placing a grounded chamber lid in its place, the chamber may be plasma cleaned. The susceptor within the chamber may be electrically biased with an RF current. A stationary magnet assembly may be substantially centered behind the grounded lid to focus the cleaning plasma on the susceptor. Following the plasma cleaning, the magnet and lid may be removed and the sputtering target may be coupled to the chamber to continue processing.

Embodiments of the invention will be discussed herein with reference to a PVD chamber. A suitable PVD chamber that may be used to practice the invention is the ENDURA® Aluminum PVD chamber available from Applied Materials, Inc., Santa Clara, Calif. It is to be understood that other chambers may be used, including those sold by other manufacturers.

Figure 1:
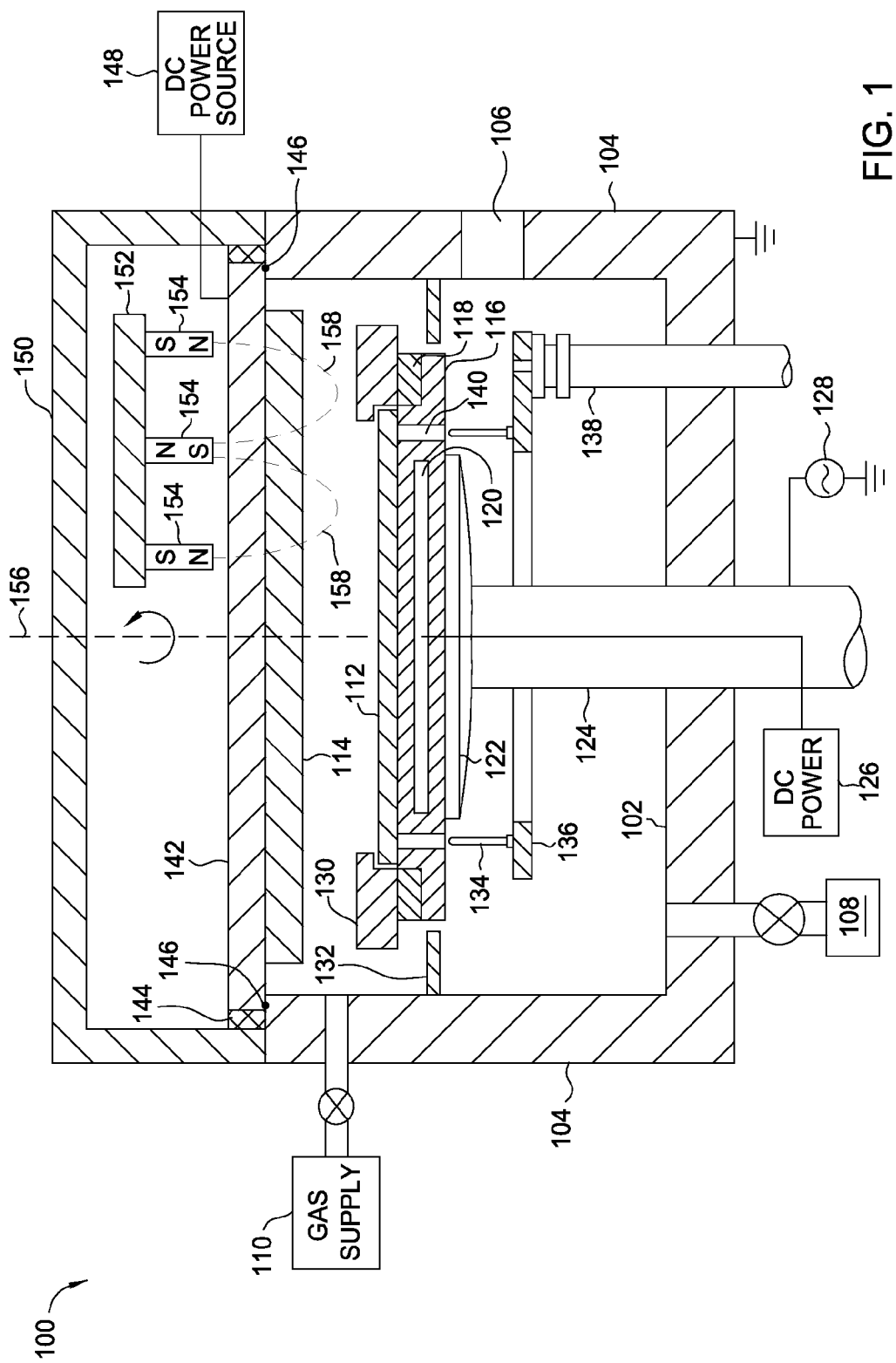
FIG. 1 is a schematic cross sectional view of a PVD apparatus 100 according to one embodiment of the invention.

FIG. 1 is a schematic cross sectional view of a PVD apparatus 100 according to one embodiment of the invention. The apparatus 100 includes a chamber body having a chamber bottom 102 and a plurality of chamber walls 104. One or more slit valve openings 106 may be present through one or more chamber walls 104. The slit valve opening 106 permits a substrate 112 to enter and exit the apparatus 100. The apparatus 100 may be evacuated by a vacuum pump 108. Processing gas may be introduced into the apparatus 100 from a gas supply 110.

The substrate 112 may rest on a susceptor 116 opposite to a sputtering target 114. In one embodiment, the susceptor 116 may comprise a ceramic material. The susceptor 116 may have an electrode 120 embedded therein that is coupled to a DC power source 126 to act as an anode in opposition to the sputtering target 114 that is electrically biased by a DC power source 148 and functions as a cathode. In one embodiment, the susceptor 116 may simply be coupled to ground. The susceptor 116 may be supported by a susceptor base 122 and raised and lowered by a shaft 124. The shaft 124 and susceptor base 122 may raise the susceptor 116 to retrieve a substrate 112 that enters the apparatus 100. Additionally, the shaft 124 and susceptor base 122 may raise the susceptor 116 to a processing position. A waste ring 118 may circumscribe the susceptor 116 to prevent unwanted deposition. An RF power source 128 may also be coupled to the susceptor 116.

When a substrate 112 is inserted into the apparatus 100 through the slit valve opening 106, the substrate 112 is initially disposed onto lift pins 134. The lift pins 134 may be disposed on a platform 136 and raised and lowered by a shaft 138. The lift pins 134 may be raised up through openings 140 in the susceptor 112 to receive the substrate 112. Thereafter, the susceptor 112 may be raised by the shaft 124 to come into contact with the substrate 112. Alternatively, the platform 136 and lift pins 134 may be lowered to lower the substrate 112 onto the susceptor 116. In one embodiment, a combination of raising the susceptor 116 and lowering the lift pins 134 and platform 136 may occur to place the substrate 112 onto the susceptor 116.

The substrate 112, after being placed onto the susceptor 116, may be raised to a processing position for material to be deposited thereon. While the substrate 112 is raised, the susceptor 116 encounters a cover ring 130 that may be used to cover portions of the susceptor 116 and waste ring 118 where deposition is undesirable. Additionally, the cover ring 130 may reduce the amount of processing gas that flows below the susceptor 116 that may deposit on undesired locations. The cover ring 130 will be supported by the susceptor 116 when in the processing position. When the susceptor 116 is lowered, the cover ring 130 may rest on a ledge 132 that is disposed in the apparatus 100 above the slit valve opening 106.

The sputtering target 114 may be electrically biased with DC power from a power source 148. The sputtering target 114 may be bonded to a backing plate 142. In one embodiment, the power source 148 may be coupled to the backing plate 142 which couples the power to the sputtering target 114. In one embodiment, the sputtering target 114 may comprise a metal. In another embodiment, the sputtering target 114 may comprise aluminum, copper, titanium, tantalum, silver, molybdenum, magnesium, or combinations thereof. In one embodiment, the backing plate 142 may comprise a material having the same electrical conductivity as the sputtering target 114. In another embodiment, the backing plate 142 may comprise a metal. In another embodiment, the backing plate 142 may comprise aluminum, copper, titanium, tantalum, silver, molybdenum, magnesium, or combinations thereof.

The backing plate 142, and hence, the sputtering target 114, may be electrically insulated from the chamber walls 104 by an electrically insulating material. In the embodiment shown in FIG. 1, the backing plate 114 is spaced from the chamber walls 104 by an electrically insulating O-ring 146.

A magnet assembly may be disposed behind the sputtering target. The magnet assembly in FIG. 1 has a magnetic yoke 152 with a plurality of permanent magnets 154 coupled thereto. In another embodiment, the magnet assembly may comprise electromagnets. In the embodiment shown in FIG. 1, the magnet assembly may rotate about the center axis 156 of the substrate 112, target 114, and backing plate 142. The magnet assembly produces a magnetic field 158 that may increase the useful life of the sputtering target 114 by increasing the uniformity of the sputtering target 114 erosion.

The magnet assembly is enclosed between the backing plate 142 and a chamber lid 150 in FIG. 1. The chamber lid 150 may be coupled to the chamber walls 104 and thus be electrically grounded. However, the chamber lid 150 is electrically isolated from the electrically biased backing plate 142 and/or sputtering target 114. In the embodiment shown in FIG. 1, the lid 150 is electrically insulated from the backing plate 142 by an insulator 144.

During the sputtering process, material from the sputtering target 114 may deposit onto the substrate 112 and any surfaces exposed to the sputtered particles such as the chamber walls 104, the cover ring 130, the ledge 132, and even the susceptor 116. The material may deposit onto the susceptor 116 due to material flaking from the walls 104. Additionally, if the substrate 112 is not flat against the susceptor 116 due to susceptor 116 warping, substrate 112 warping, or material flakes deposited onto the susceptor 116, a gap may be present between the substrate 112 and the susceptor 116 such that material may enter the gap and deposit on the susceptor 116. The susceptor 116, if material deposits thereon, may not function effectively. Thus, the susceptor 116 may be periodically cleaned.

Additionally, material from other processing chambers may enter into the chamber body when substrates are inserted or removed. If the material is a dielectric material, the dielectric material may deposit onto the susceptor 116 which may lead to shielding of the electrostatic charge on the substrate 112. Thus, the substrate 112 may pop off of the susceptor 116 if too much dielectric material deposited onto the susceptor 116. Thus, the susceptor 116 may be periodically cleaned.

Figure 2:
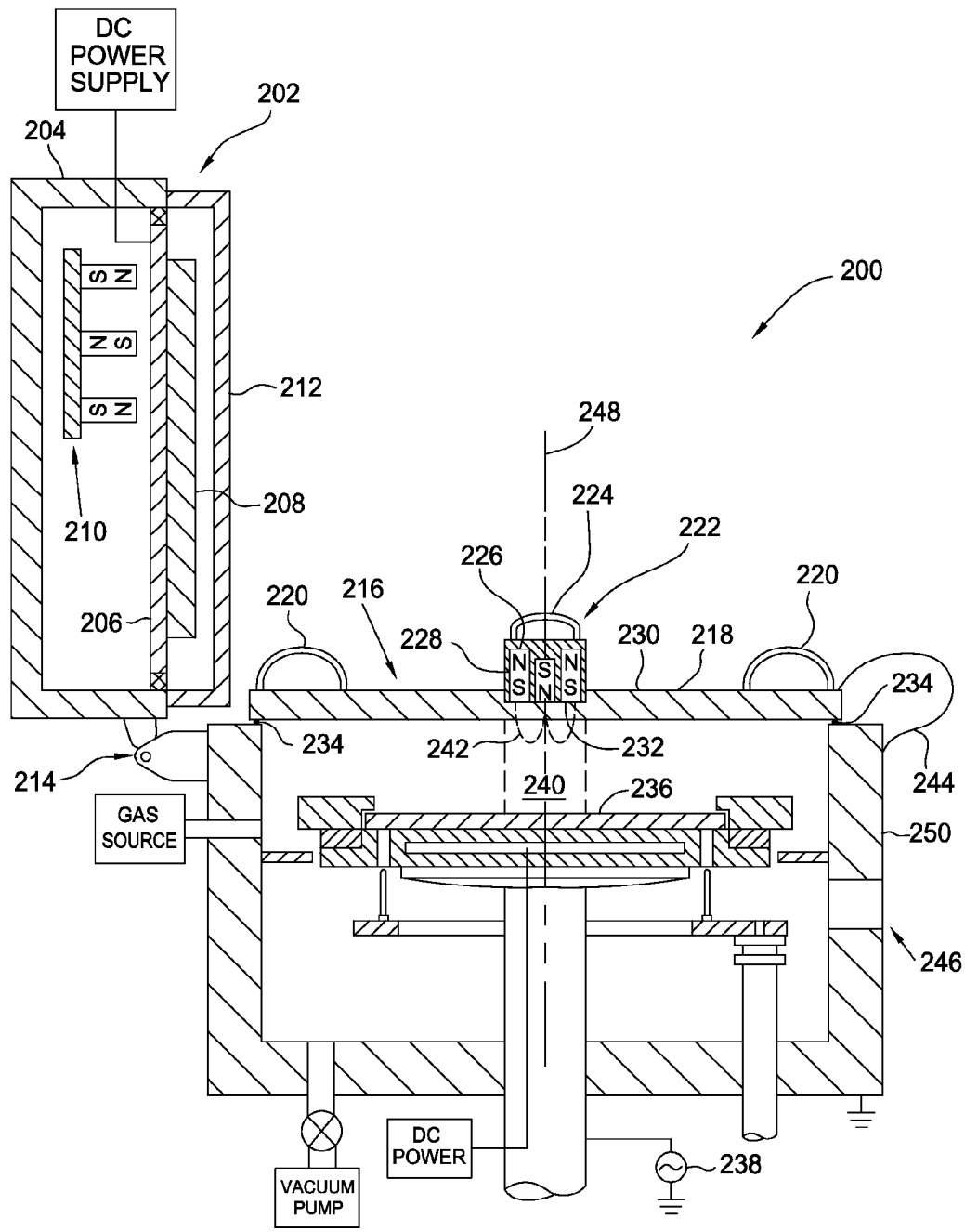
FIG. 2 is a schematic cross sectional view of a PVD apparatus 200 according to another embodiment of the invention.

FIG. 2 is a schematic cross sectional view of a PVD apparatus 200 according to another embodiment of the invention. The apparatus 200 comprises a first lid assembly 202 having a lid 204, enclosing a magnet assembly 210 between the lid 204 and a backing plate 206. A sputtering target 208 may be bonded to the backing plate 206. The first lid assembly 202 is shown pivoted away from the processing chamber 246 on a hinge 214. Thus, the first lid assembly 202 is still coupled with the chamber 246. A cover 212 may be placed over the sputtering target 208 for safety to prevent any exposure of the sputtering target 208, which would be an electrode, should any technician accidentally turn on the DC power to the sputtering target 208. In one embodiment, the cover 212 may comprise a dielectric material.

The lid assembly 202 may be pivoted away from the chamber 246 to perform routine maintenance, target replacement, and other processes such as chamber 246 cleaning. To clean the chamber 246, a second lid assembly 216 may be coupled to the chamber 246. The second lid assembly 216 comprises a lid 218 having one or more handles 220 to permit the lid 218 to be easily coupled to and removed from the chamber 246. It is to be understood that while two handles 220 have been shown, more or less handles 220 may be present. Additionally, while handles 220 are shown, it is to be understood that other elements may be used that can provide the same function of permitting a technician to couple the lid 218 to or remove the lid 218 from the chamber 246. In one embodiment, the lid 218 may comprise the same material as the chamber walls 250. The lid 218 may be coupled with the chamber 246 by one or more O-rings 234 to permit the chamber 246 sealed by the lid 218 to be evacuated. Additionally, the lid 218 may be grounded to the chamber 246 by a strap 244 that couples to the lid 218 and one or more chamber walls 250. While not shown, one or more clamps may be present to clamp the lid 218 to the chamber walls 250 to ensure a good vacuum seal, however, it is contemplated that the lid 218 may be coupled to the chamber walls 250 by placing the lid 218 thereon and evacuating the chamber 246 such that the vacuum level compresses the O-ring 234 between the walls 250 and the lid 218 and seals the chamber 246.

The lid 218 has a back surface 230 that faces atmosphere when the chamber 246 is evacuated. The back surface 230 may have an indentation 232 therein to permit a magnet assembly 222 to be placed snuggly therein. The indentation 232 in the lid 218 is sized to match the outside diameter of the magnet assembly 222 and is a visual indicator for a technician when installing the magnet assembly 222.

The magnet assembly 222 may comprise a magnet body 226 having one or more magnets 238 disposed therein. The magnet assembly 222 may have one or more handles 224 to permit a technician to place the magnet assembly 222 in the indentation 232 and remove the magnet assembly 222 from the indentation 232. It is to be understood that while one handle 224 has been shown for the magnet assembly 222, more handles 224 may be present. Additionally, while a handle 224 is shown, it is to be understood that other elements may be used that can provide the same function of permitting a technician to place the magnet assembly 222 in the indentation 232 or remove the magnet assembly 222 from the indentation. In one embodiment, the magnet assembly 222 rests in the indentation 232. In another embodiment, the magnet assembly 222 is fastened to the indentation 232. It is to be understood that the indentation 232 need not be present to couple the magnet assembly 222 to the lid 218. For example, the magnet assembly 222 may simply be placed on a center area of the lid 218. Alternatively, the magnet assembly 222 may be fastened to the lid 218.

During a cleaning process, the susceptor 236 may be electrically biased with an RF current from a power source 238 and cleaning gas is introduced into the chamber 246 from a gas source. The RF current applied to the ceramic susceptor 236 generates a plasma within the chamber 246. The magnetic field 242 generated by the magnet assembly 222 may confine a portion of the plasma within an area 240 near the center of the susceptor 236. The plasma sputter etches the susceptor 236 to remove undesired material. Additionally, other chamber 246 components may be cleaned. Thus, the higher density of plasma near the center of the susceptor 236 due to the magnet assembly 222 may accommodate enhanced cleaning of the susceptor 236. If the lid assembly 202 were left in place for the cleaning and electrically grounded, the magnet assembly 210, which rotates about the center axis 248 of the susceptor 236, would generate a magnetic field away from the center of the susceptor 236 such that the susceptor 236 may not be effectively cleaned. It has been surprisingly found that when using a magnet assembly 222 centering the magnetic field 242 over the susceptor 236 as compared to a magnet assembly 210 that rotates about the center axis 248, the susceptor cleaning time may be cut in half. By cutting the cleaning time, the chamber 246 downtime may be reduced. Thus, system utilization and substrate throughput may be increased by using the magnet assembly 222 and lid assembly 216 for cleaning rather than a grounded lid assembly 202 having the magnet assembly 210 used for sputter deposition.

The magnet assembly 222 shown in FIG. 2 is stationary and does not rotate. It is to be understood that other magnet assemblies are possible. For example, a magnet assembly centered on the center axis 248 that rotates about its center axis 248 may be used. In one embodiment, multiple magnet assemblies may be used such that one magnet assembly has the same center axis 248 as the susceptor and the other magnet assemblies rotate about the center axis 247. Additionally, while permanent magnets 228 are shown, it is contemplated that electromagnets may be used in addition to or instead of permanent magnets 228.

After the plasma cleaning process, the second lid assembly 216 may be removed and the cover 212 may be removed from the first lid assembly 202. The first lid assembly 202 may then be pivoted back into position to enclose the processing chamber 246. Thereafter, regular processing may continue on substrates.

Figure 3A:
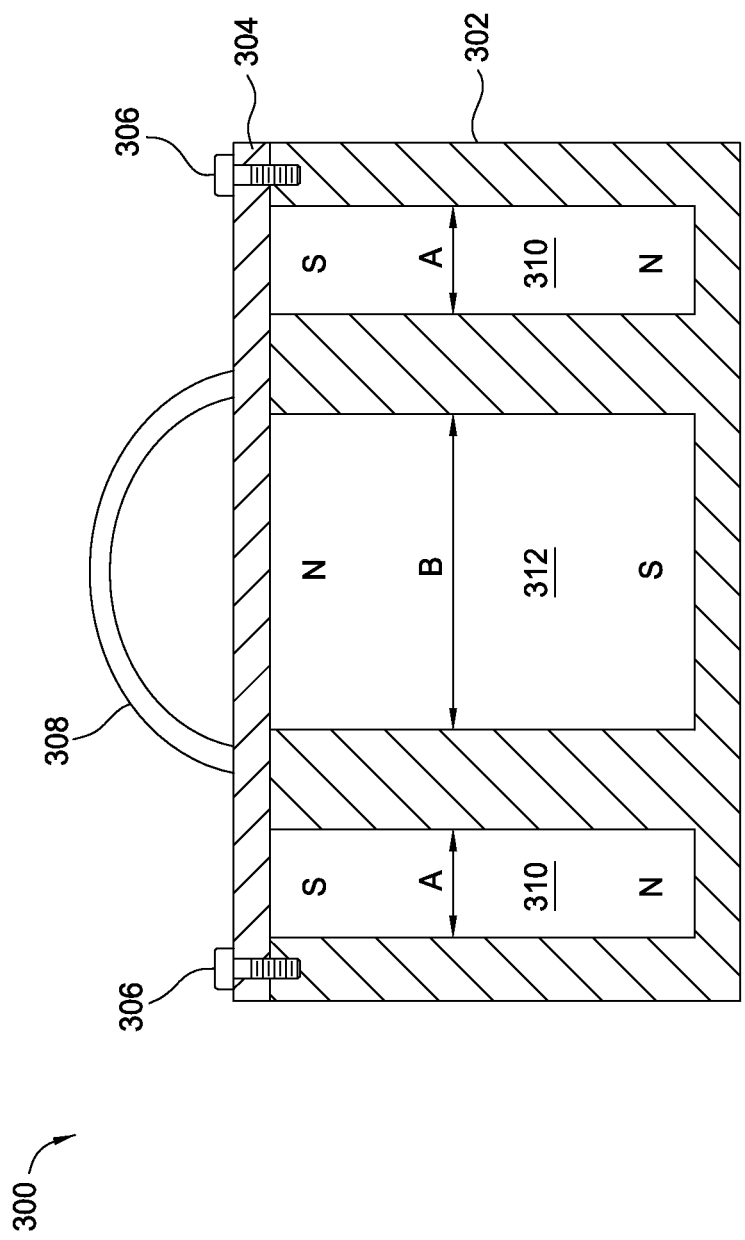
FIG. 3A is a schematic cross sectional view of a magnet assembly according to one embodiment of the invention.
Figure 3B:
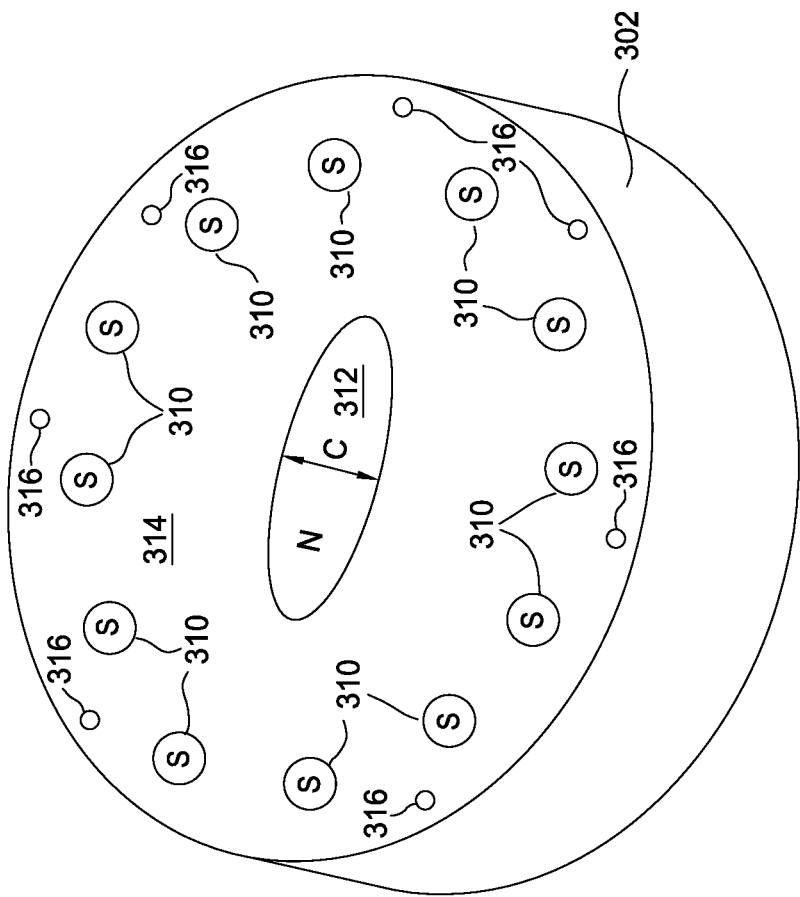
FIG. 3B is a schematic isometric view of the magnet assembly of FIG. 3A.

FIG. 3A is a schematic cross sectional view of a magnet assembly 300 according to one embodiment of the invention. FIG. 3B is a schematic isometric view of the magnet assembly 300 of FIG. 3A. The magnet assembly 300 includes a body 302 for holding the magnets 310 and 312 of the magnet assembly 300. A lid 304 may be coupled against the body 302 to seal the magnets 310 and 312 in the body 302. In one embodiment, the body 302 has a slot therein for each magnet 310 and 312 to be used in the magnet assembly 300. The lid 304 may be fastened to the body 302 with one or more fastening mechanisms 304. In one embodiment, the fastening mechanism 304 may comprise a screw that is received in an opening 316 formed in the body 302. One or more handles 308 may be present for removing the lid 304 from the body 302. Additionally, the handle 308 may be used to place on or remove the magnet assembly 300 from the cleaning lid. It is to be understood that while one handle 308 has been shown for the magnet assembly 300, more handles 308 may be present. Additionally, while a handle 308 is shown, it is to be understood that other elements may be used that can provide the same function of permitting a technician to place the magnet assembly 300 on or remove the magnet assembly 300 from the cleaning lid.

In the embodiment shown in FIGS. 3A and 3B, twelve magnets 310 are shown surrounding a center magnet 312. The twelve magnets 310 and the center magnet 312 are shown to be flush with the upper surface 314 of the body. However, it is contemplated that the magnets 310 and 312 may extend to a height below the surface 314 of the body. The twelve magnets 310 are of the same polarity facing the lid 304 and opposite the polarity of the center magnet 312 facing the lid 304. The twelve magnets 310 facing the surface 218 opposite the lid 304 are opposite the polarity of the center magnet 312 facing the surface 318 opposite the lid 304. It is to be understood that while the magnet assembly 300 is shown having the magnets 310 and 312 within slots formed in the body 302 that are open facing the lid 304 having the handle 308, the slots may be formed within the surface 318 and a lid may be placed over the magnets inserted therein.

It is to be understood that while twelve magnets 310 are shown surrounding a single center magnet 312, other magnet configurations are contemplated. For example, more or less magnets 310 may be present. Additionally, more or less center magnets 312 may be present. Electromagnets may also be used in conjunction with or alternatively to the permanent magnets shown in FIGS. 3A and 3B.

As shown in FIG. 3A, the outer magnets 310 have substantially the same diameter as shown by arrows "A" which is less than the width of the center magnet 312 as shown by arrows "B". As may be seen in FIG. 3B, the outer magnets 310 may be substantially circular while the center magnet 312 may be oval. As shown in FIGS. 3A and 3B, the center magnet 312 may have multiple different widths shown by arrows "B" and "C" due to its oval shape. It is to be understood that while circular magnets 310 and an oval magnet 312 have been shown, other shapes are contemplated. For example, the center magnet 312 may be circular.

To perform the cleaning process, the second lid assembly with the stationary magnet arrangement is sealed to the processing chamber and the processing chamber is evacuated. During the cleaning process, the processing chamber will be maintained at a chamber pressure of between about 1 mTorr to about 15 mTorr. In one embodiment, the chamber pressure is between about 2 mTorr to about 7 mTorr. In another embodiment, the chamber pressure is between about 3 mTorr and about 7 mTorr. The cleaning gas is introduced to the processing chamber. In one embodiment, the cleaning gas may comprise an oxygen containing gas. In another embodiment, the cleaning gas may comprise oxygen. In another embodiment, the cleaning gas may comprise ozone. In another embodiment, the cleaning gas may comprise an inert gas. In another embodiment, the cleaning gas may comprise argon. In another embodiment, the cleaning gas may comprise a mixture of argon and hydrogen.

The cleaning gas may be provided to the processing chamber at a flow rate of between about 6.67 sccm/L (standard cubic centimeters per minute per liter of chamber volume) to about 200 sccm/L. In another embodiment, the cleaning gas may be provided at a flow rate of between about 8 sccm/L to about 150 sccm/L. In another embodiment, the cleaning gas may be provided at a flow rate of between about 20 sccm/L to about 80 sccm/L. In another embodiment, the cleaning gas may be provided at a flow rate of between about 16.67 sccm/L and about 66.67 sccm/L. In another embodiment, the cleaning gas may be provided at a flow rate of between about 24 sccm/L to about 50 sccm/L. During the cleaning, RF power is provided to the pedestal. In one embodiment, the RF power provided may be about 13.56 MHz at a power of about 0.4 W/cm$^2$ to about 4.0 W/cm$^2$. In general, the temperature for cleaning may be between about room temperature and about 100 degrees Celsius. In another embodiment, the temperature for cleaning may be between about 25 degrees Celsius and about 90 degrees Celsius. In another embodiment, the temperature for cleaning may be between about 35 degrees Celsius and about 50 degrees Celsius.

In one embodiment, the pedestal may be maintained at a temperature of between about 90 degrees Celsius and about 110 degrees Celsius, argon and hydrogen may be introduced at a flow rate of between about 20 sccm/L and about 25 sccm/L for a time period of between about 5 seconds and about 10 seconds while no power is applied to the pedestal for a first step. The pedestal may have a diameter of about 300 mm, and the chamber may have a volume of between about 1 liter and about 3 liters. Then, only argon is introduced for a time period of about 5 seconds to about 10 seconds at a rate of between about 200 sccm/L and about 210 sccm/L while no power is applied for the second step. Then, only argon is introduced in a third step at a flow rate of between about 200 sccm/L and about 210 sccm/L for a time period of between about 10 seconds and about 15 seconds while power is delivered to the pedestal at about 0.4 W/cm$^2$ to about 4.0 W/cm$^2$. Then, in a fourth step, only argon is introduced at a rate of between about 150 sccm/L and about 160 sccm/L for about 180 seconds to about 190 seconds while about 0.4 W/cm$^2$ to about 4.0 W/cm$^2$ of power is delivered to the pedestal. Finally, in a fifth step, only argon is introduced at a rate of between about 50 sccm/L to about 60 sccm/L for about 180 seconds to about 190 seconds while about 0.4 W/cm$^2$ to about 4.0 W/cm$^2$ of power is delivered to the pedestal. Then, the chamber remains idle for about 5 minutes and steps 1-5 are repeated.

In another embodiment, the pedestal may be maintained at between about 25 degrees Celsius to about 100 degrees Celsius, argon may be introduced at a flow rate of between about 80 sccm/L and about 100 sccm/L for about 5 seconds to about 10 seconds while no power is applied to the pedestal for a first step. The pedestal may have a diameter of about 300 mm, and the chamber may have a volume of between about 1 liter and about 3 liters. Then, argon is introduced for about 5 seconds to about 10 seconds at a rate of about 80 sccm/L to about 100 sccm/L while about 0.4 W/cm$^2$ to about 4.0 W/cm$^2$ of power is applied for the second step. Then, argon is introduced in a third step at a rate of about 24 sccm/L to about 30 sccm/L for about 8000 seconds to about 8500 seconds while about 0.4 W/cm$^2$ to about 4.0 W/cm$^2$ of power is delivered to the pedestal. Then, the chamber remains idle for about 1 minutes and steps 1-3 may be repeated if necessary.

In another embodiment, the cleaning process may occur with a constant argon flow rate of about 200 sccm/L and a pressure of about 3 mTorr. In another embodiment, the cleaning process may occur with a constant argon flow rate of about 150 sccm/L and a chamber pressure of about 2 mTorr. In another embodiment, the cleaning process may occur at a constant argon flow rate of about 80 sccm/L and a pressure of about 15 mTorr. In another embodiment, the cleaning process may occur at a constant argon flow rate of about 24 sccm/L and a pressure of about 6 mTorr.

By utilizing the above cleaning parameters, the chamber cleaning process may last about 10 hours. Prior to utilizing the above conditions and hardware, the cleaning process would take about 20 hours and be performed about every 2 weeks. Thus, the above cleaning parameters and hardware significantly reduce chamber downtime and increase substrate throughput. The cleaning process involves removing undesired contaminates from the processing chamber that has deposited on one or more walls of the processing chamber and any other exposed surfaces.

By replacing the sputtering lid with a grounded chamber lid and a magnet assembly centered on the center axis of the susceptor, the susceptor may be effectively cleaned during a plasma cleaning process. The magnet assembly centered about the center axis of the susceptor confines a higher density plasma near the center of the susceptor as compared to the rotating sputter magnet assembly that rotates about the center axis. Thus, the grounded lid assembly separate from the sputtering lid assembly may reduce chamber cleaning times and increase substrate throughput.

While the foregoing is directed to embodiments of the present invention, other and further embodiments of the invention may be devised without departing from the basic scope thereof, and the scope thereof is determined by the claims that follow.

The invention claimed is:

1. A method of servicing a processing chamber, comprising:
    removing a first lid from a plurality of processing chamber walls of the processing chamber to expose a processing space;
    placing a second lid, separate from the first lid, into contact with the plurality of processing chamber walls to re-enclose the processing space;
    placing a magnet assembly on a surface of the second lid opposite to the processing space, wherein the magnet assembly is centrally located and stationary;
    flowing a gas into the processing chamber; and
    applying an RF current to a susceptor disposed in the processing space, thereby igniting a plasma within the processing space.

2. The method of claim 1, wherein the first lid remains coupled to the processing chamber while the second lid is in contact with the plurality of processing chamber walls and re-enclosing the processing space.

3. The method of claim 1, further comprising:
    cleaning the processing chamber for a first period of time of between about 5 seconds to about 10 seconds while maintaining the susceptor at a temperature of between about 25 degrees Celsius to about 100 degrees Celsius and flowing argon at a flow rate of between about 80 sccm/L and about 100 sccm/L;
    cleaning the processing chamber for a second period of time of between about 5 seconds to about 10 seconds while argon is flowed at a rate of about 80 sccm/L to about 100 sccm/L and about 0.4 W/cm2 to about 4.0 W/cm2 of power is applied to the susceptor; and
    cleaning the processing chamber for a third period of time of between about 8000 seconds and about 8500 seconds while argon is introduced at a flow rate of about 24 sccm/L to about 30 sccm/L and while about 0.4 W/cm$^2$ to about 4.0 W/cm$^2$ of power is delivered to the susceptor.

4. The method of claim 3, further comprising repeating the cleaning of the processing chamber for the first period of time, second period of time and third period of time.

5. The method of claim 4, further comprising permitting the chamber to remain idle for a period of time of about 4 minutes to about 6 minutes prior to the repeating.

6. The method of claim 1, wherein the gas is selected from the group consisting of argon, hydrogen, oxygen containing gas and combinations thereof.

7. The method of claim 6, wherein the processing chamber is maintained at a pressure of between about 1 mTorr and 15 mTorr.

8. The method of claim 1, wherein the gas comprises argon, the gas is between about room temperature and about 100 degrees Celsius, and the RF current is from about 0.4 W/cm$^2$ to about 4.0 W/cm$^2$.

9. The method of claim 8, wherein the argon is introduced for a time period of from about 8000 seconds to 8500 seconds.

* * * * *